(12) United States Patent
Tomita et al.

(10) Patent No.: US 11,973,158 B2
(45) Date of Patent: Apr. 30, 2024

(54) PHOTOELECTRIC CONVERSION ELEMENT AND METHOD FOR MANUFACTURING PHOTOELECTRIC CONVERSION ELEMENT

(71) Applicant: IDEMITSU KOSAN CO., LTD., Tokyo (JP)

(72) Inventors: Hiroshi Tomita, Atsugi (JP); Hiroki Sugimoto, Atsugi (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 67 days.

(21) Appl. No.: 17/415,695

(22) PCT Filed: Dec. 12, 2019

(86) PCT No.: PCT/JP2019/048683
§ 371 (c)(1),
(2) Date: Jun. 17, 2021

(87) PCT Pub. No.: WO2020/129803
PCT Pub. Date: Jun. 25, 2020

(65) Prior Publication Data
US 2022/0052216 A1    Feb. 17, 2022

(30) Foreign Application Priority Data

Dec. 19, 2018  (JP) ................... 2018-237248

(51) Int. Cl.
*H01L 31/0749*    (2012.01)
*H01L 31/0224*    (2006.01)

(52) U.S. Cl.
CPC .. *H01L 31/0749* (2013.01); *H01L 31/022425* (2013.01)

(58) Field of Classification Search
CPC ..... H01L 31/022425; H01L 31/022466; H01L 31/0322; H01L 31/03923; H01L 31/03928; H01L 31/0725; H01L 31/0749
See application file for complete search history.

(56) References Cited

U.S. PATENT DOCUMENTS

| | | |
|---|---|---|
| 9,786,804 B2 | 10/2017 | Iwata et al. |
| 2010/0247745 A1 | 9/2010 | Rudmann et al. |
| 2012/0168910 A1 | 7/2012 | Jackrel et al. |
| 2012/0313200 A1 | 12/2012 | Jackrel et al. |

(Continued)

FOREIGN PATENT DOCUMENTS

| | | |
|---|---|---|
| JP | 2014-524145 A | 9/2014 |
| JP | 2014-232764 A | 12/2014 |

(Continued)

OTHER PUBLICATIONS

English Machine Translation JP 2014232764, accessed Jun. 4, 2022.*

(Continued)

*Primary Examiner* — Mayla Gonzalez Ramos
(74) *Attorney, Agent, or Firm* — Foley & Lardner LLP (57) ABSTRACT

A photoelectric conversion element having a photoelectric conversion layer formed between a first electrode layer and a second electrode layer, in which the photoelectric conversion layer contains Cu and Ag, which are Group I elements, In and Ga, which are Group III elements, and Se and S, which are Group VI elements. A portion at which a minimum value of a band gap appears in a thickness direction of the photoelectric conversion layer is included in the intermediate region. When a ratio of a mole amount of Ag to a sum of mole amounts of the Group I elements other than Ag, the Group III elements, and the Group VI elements is defined as an Ag concentration, a portion at which a maximum value of the Ag concentration appears in the thickness direction of the photoelectric conversion layer is included in the intermediate region.

9 Claims, 7 Drawing Sheets

(56) References Cited

U.S. PATENT DOCUMENTS

| | | |
|---|---|---|
| 2013/0164885 A1 | 6/2013 | Liang et al. |
| 2013/0164886 A1* | 6/2013 | Liang ............... H01L 21/02614 |
| | | 257/E31.027 |
| 2014/0264708 A1* | 9/2014 | Van Duren ........... H01L 31/065 |
| | | 257/458 |
| 2017/0125618 A1 | 5/2017 | Kim et al. |

FOREIGN PATENT DOCUMENTS

| | | | | |
|---|---|---|---|---|
| JP | 2014232764 A | * | 12/2014 | |
| JP | 2017-128792 A | | 7/2017 | |
| WO | WO-2011040645 A1 | * | 4/2011 | ......... H01L 31/0322 |
| WO | WO-2015/005091 A1 | | 1/2015 | |

OTHER PUBLICATIONS

Machine translation of JP-2014232764-A, Izumi M. (Year: 2014).*
Wu et al., "Preparation and Characterization of Silver-Doped $Cu(In,Ga)Se_2$ Films via Nonvacuum Solution Process," Journal of the American Ceramic Society, vol. 99, Issue 10, 2016, pp. 3280-3285.
Tauchi et al., "Characterization of $(AgCu)(InGa)Se_2$ Absorber Layer Fabricated by a Selenization Process from Metal Precursor," IEEE Journal of Photovoltaics, vol. 3, No. 1, Jan. 2013, pp. 467-471.
International Searching Authority, "International Search Report," issued in connection with International Patent Application No. PCT/JP2019/048683, dated Mar. 3, 2020.
International Searching Authority, "Written Opinion," issued in connection with International Patent Application No. PCT/JP2019/048683, dated Mar. 3, 2020.

* cited by examiner

PHOTOELECTRIC CONVERSION ELEMENT AND METHOD FOR MANUFACTURING PHOTOELECTRIC CONVERSION ELEMENT

CROSS-REFERENCE TO RELATED APPLICATIONS

The present application claims priority under 37 U.S.C. § 371 to International Patent Application No. PCT/JP2019/048683, filed Dec. 12, 2019, which claims priority to and the benefit of Japanese Patent Application No. 2018-237248, filed on Dec. 19, 2018. The contents of these applications are hereby incorporated by reference in their entireties.

TECHNICAL FIELD

The present invention relates to a photoelectric conversion element and a method for manufacturing a photoelectric conversion element.

BACKGROUND ART

Hitherto, CIS-based photoelectric conversion elements in which a Group I-III-VI$_2$ compound semiconductor having a chalcopyrite structure containing Cu, In, Ga, Se, and S is used as a photoelectric conversion layer have been proposed. This type of photoelectric conversion element can be manufactured at a relatively low cost and, furthermore, has a large absorption coefficient at wavelengths that range from visible light to near-infrared light, which makes a high photoelectric conversion efficiency expected.

The CIS-based photoelectric conversion element is configured by, for example, forming a metal rear surface electrode layer on a substrate, forming a photoelectric conversion layer that is a Group I-III-VI$_2$ compound on the rear surface electrode layer, and, furthermore, forming a buffer layer and a window layer that is formed of a transparent conductive film in order.

In addition, in the CIS-based photoelectric conversion element, it is important to bring the minimum value of the band gap of the photoelectric conversion layer to the inside of the photoelectric conversion layer in the film thickness direction (double graded structure) in order to avoid interface recombination. As means for realizing the double graded structure, the concentration control of S/VI or Ga/III in the photoelectric conversion layer in the depth direction is known.

Furthermore, as a technique for increasing the efficiency of CIS-based photoelectric conversion elements, substitution of some of Cu, which is a Group I element, in the CIS-based photoelectric conversion layer into Ag is also known.

For example, Patent Literature 1 discloses that, regarding a photoelectric device, (Ag, Cu) (In, Ga) (Se, S)$_2$ is applied for an absorber layer and the band gap of the absorber is substantially changed with Ag. In addition, Patent Literature 1 discloses that the absorber layer has a transition region disposed between a surface region and a bulk region and the mole ratio of transition region Ag/(Ag+Cu) in the transition region is higher than the ratio of surface region Ag/(Ag+Cu) in the surface region.

In addition, Patent Literature 2 discloses that an ACIGS thin film, which is applicable as a light absorption layer for solar cells, is formed by partially substituting Cu in CIGS with Ag.

CITATION LIST

Patent Literature

Patent Literature 1

Published Japanese Translation No. 2014-524145

Patent Literature 2

Japanese Patent Laid-Open No. 2017-128792

SUMMARY OF INVENTION

Technical Problem

When a high concentration of Ag is added to the front surface side of the photoelectric conversion layer that becomes the light-receiving surface side of the photoelectric conversion element, lattice mismatch in the interface between the photoelectric conversion layer and the buffer layer (a second electrode layer in a case where there is no buffer layer) becomes large. Such expansion of lattice mismatch decreases the efficiency of photoelectric conversion due to an increase in recombination of carriers and is thus desirably avoided.

On the other hand, addition of a high concentration of Ag to the rear surface side of the photoelectric conversion layer, which faces the substrate, leads to an increase in the amount of S in the rear surface side of the photoelectric conversion layer and an increase in the number of voids in the rear surface side of the photoelectric conversion layer. As a result, there is a concern regarding the degradation of adhesiveness between the photoelectric conversion layer and the rear surface electrode or an increase in the serial resistance Rs of the photoelectric conversion element to which this photoelectric conversion layer has been applied.

The present invention has been made in consideration of the above-described circumstance and provides means for effectively suppressing the recombination of carriers in the photoelectric conversion layer to which Ag has been added and for improving the efficiency of the photoelectric conversion of the photoelectric conversion element.

Solution to Problem

A photoelectric conversion element, which is an example of the present invention, is a photoelectric conversion element having a photoelectric conversion layer that is formed between a first electrode layer and a second electrode layer, in which the photoelectric conversion layer contains Cu and Ag, which are Group I elements, In and Ga, which are Group III elements, and Se and S, which are Group VI elements. The photoelectric conversion layer has a front surface-side region that is positioned on a light-receiving surface side, a rear surface-side region that is positioned on a rear surface side of the light-receiving surface, and an intermediate region that is positioned between the front surface-side region and the rear surface-side region. A portion at which a minimum value of a band gap appears in a thickness direction of the photoelectric conversion layer is included in the intermediate region. When a ratio of a mole amount of Ag to a sum of mole amounts of the Group I elements other than Ag, the Group III elements, and the Group VI elements is defined as an Ag concentration, a portion at which a maximum value of the Ag concentration appears in the thickness direction of the photoelectric conversion layer is included in the intermediate region.

Advantageous Effects of Invention

According to the photoelectric conversion element, which is an example of the present invention, the portion at which the minimum value of the band gap appears in the thickness direction of the photoelectric conversion layer and the portion at which the maximum value of the Ag concentration appears are both included in the intermediate region, and the recombination of carriers in the portion at which the minimum value of the band gap appears is suppressed. This makes it possible to improve the efficiency of the photoelectric conversion of the photoelectric conversion element.

DESCRIPTION OF EMBODIMENTS

Hereinafter, an embodiment will be described with reference to the drawings.

In the embodiment, in order to make description easily understandable, structures or elements other than a major portion of the present invention will be simplified or skipped in the description. In addition, in the drawings, the same elements will be given the same reference signs. The drawings schematically show the thickness, shape, or the like of each layer and thus do not show actual thicknesses, shapes, or the like.

<Structure of Photoelectric Conversion Element 10>

Figure 1:
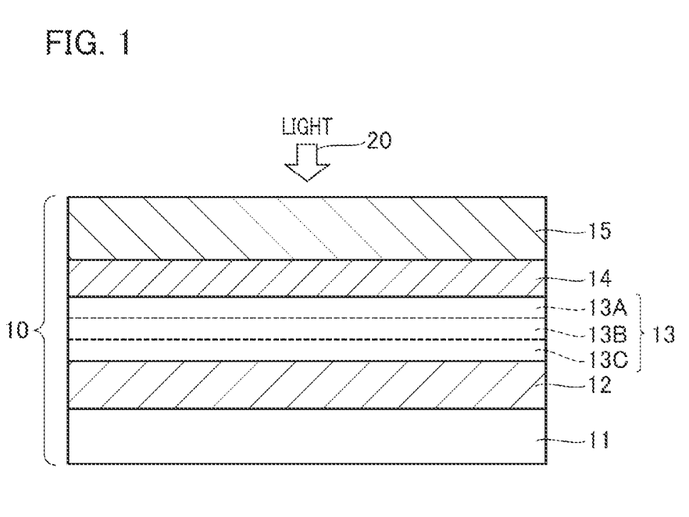
FIG. 1 is a cross-sectional view showing an example of a photoelectric conversion element in an embodiment.

FIG. 1 is a cross-sectional view in a thickness direction showing an example of a photoelectric conversion element 10 in an embodiment.

The photoelectric conversion element 10 has, for example, a substrate structure in which a first electrode layer 12, a photoelectric conversion layer 13, a buffer layer 14, and a second electrode layer 15 are stacked on a substrate 11. Light 20 such as solar light is incident on the photoelectric conversion element 10 from a side opposite to the substrate 11 side.

(Substrate 11)

The substrate 11 can be selected from a glass substrate, a resin substrate, a metal substrate, and the like. The substrate 11 may contain alkali metal such as sodium or potassium. The shape of the substrate 11 is, for example, a square, but is not limited thereto. In addition, as the substrate 11, a hard substrate is supposed; however, instead, a flexible substrate having flexibility may also be used. Examples of the flexible substrate include a stainless steel foil, a titanium foil, a molybdenum foil, a ceramic sheet, or a resin sheet.

(First Electrode Layer 12)

The first electrode layer 12 is disposed on the substrate 11. The first electrode layer 12 is, for example, a metal electrode layer. The first electrode layer 12 preferably includes a material that does not easily react with the photoelectric conversion layer 13 in a manufacturing method which will be described below. The first electrode layer 12 can be selected from molybdenum (Mo), titanium (Ti), chromium (Cr), and the like. The first electrode layer 12 may contain the same material as a material that is contained in the second electrode layer 15 which will be described below. The thickness of the first electrode layer 12 is set to, for example, 200 nm to 500 nm.

(Photoelectric Conversion Layer 13)

Figure 2:
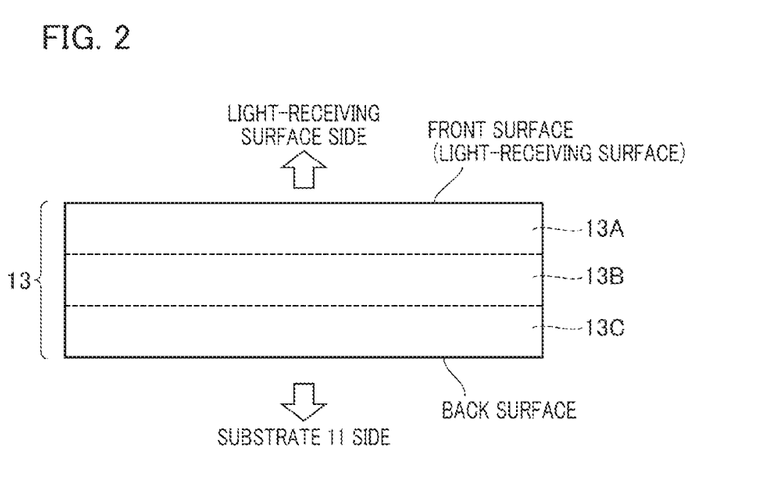
FIG. 2 is a cross-sectional view showing an example of a photoelectric conversion layer.

The photoelectric conversion layer 13 is disposed on the first electrode layer 12. The photoelectric conversion layer 13 functions as a polycrystal or microcrystal p-type compound semiconductor layer. The photoelectric conversion layer 13 includes a mixed crystal compound (I-III-(Se, S)$_2$) having a chalcopyrite structure containing Group I elements, Group III elements, and selenium (Se) and sulfur (S) as Group IV elements (chalcogen elements). The Group I elements can be selected from copper (Cu), silver (Ag), gold (Au), and the like. The Group III elements can be selected from indium (In), gallium (Ga), aluminum (Al), and the like. In addition, the photoelectric conversion layer 13 may contain, as Group VI elements, in addition to selenium and sulfur, tellurium (Te) or the like. In addition, the photoelectric conversion layer 13 may contain an alkali metal such as Li, Na, K, Rb, or Cs. The thickness of the photoelectric conversion layer 13 is set to, for example, 1.0 μm to 3.0 μm.

The photoelectric conversion layer 13 in the present embodiment contains at least indium and gallium as Group III elements and contains at least sulfur as Group VI elements. Due to gallium and sulfur, the photoelectric conversion layer 13 has a double graded structure in which the band gap is large in the light-receiving surface side (the upper side in the drawing) and in the substrate 11 side (the lower side in the drawing), respectively, and the band gap is small in the inside (middle).

The photoelectric conversion layer 13 in the present embodiment has three regions of a front surface-side region 13A, an intermediate region 13B, and a rear surface-side region 13C in the thickness direction (the vertical direction in the drawing) of the photoelectric conversion layer 13. The front surface-side region 13A is positioned in the light-receiving surface side of the photoelectric conversion layer 13, and the rear surface-side region 13C is positioned in the substrate 11 side of the photoelectric conversion layer 13, which becomes the rear surface side with respect to the light-receiving surface. The intermediate region 13B is positioned between the front surface-side region 13A and the rear surface-side region 13C in the photoelectric conversion layer 13. A portion at which the minimum value of the band gap appears in the thickness direction of the photoelectric conversion layer 13 is present in the intermediate region 13B.

When the film thickness of the photoelectric conversion layer 13 is normalized as 1, the intermediate region 13B in the photoelectric conversion layer 13 is preferably present within a range of 0.1 to 0.7 of the film thickness of the photoelectric conversion layer 13 from the front surface of the photoelectric conversion layer 13 on the light-receiving surface side as a reference. In this case, the front surface-side region 13A is formed within a region of 0 to less than 0.1 of the film thickness from the front surface of the photoelectric conversion layer 13 on the light-receiving surface side. Similarly, the rear surface-side region 13C is formed within a region from more than 0.7 to 1.0 of the film thickness from the front surface of the photoelectric conversion layer 13 on the light-receiving surface side.

The film thickness of the front surface-side region 13A set as described above makes it possible to suppress the expansion of lattice mismatch in the interface between the photoelectric conversion layer 13 and the buffer layer 14 (the second electrode layer 15 in a case where there the buffer layer 14 is not present) and to suppress an increase in the recombination of carriers.

In addition, the film thickness of the rear surface-side region 13C set as described above makes it possible to suppress an increase in the amount of S and an increase in the number of voids in the first electrode layer 12 side (the rear surface electrode side) of the photoelectric conversion layer 13. As a result, it is possible to suppress the degradation of adhesiveness between the photoelectric conversion layer 13 and the first electrode layer 12. In addition, it is possible to suppress an increase in the serial resistance Rs of the photoelectric conversion element 10 to which this photoelectric conversion layer 13 has been applied.

In addition, the photoelectric conversion layer 13 in the present embodiment contains at least Ag as Group I elements. Ag added to the photoelectric conversion layer 13 suppresses an antisite defect $In_{Cu}$. Therefore, the carrier density of the photoelectric conversion layer 13 increases, and it is possible to reduce the recombination of carriers generated in the photoelectric conversion layer 13.

A portion at which the maximum value of the Ag concentration appears in the thickness direction of the photoelectric conversion layer 13 is present in the intermediate region 13B. Here, the Ag concentration indicates the ratio (Ag/non-Ag I+III+VI) of the mole amount of Ag to the sum of the mole amounts of the Group I elements other than Ag, the Group III elements, and the Group VI elements in the photoelectric conversion layer 13.

In the present embodiment, since the portion at which the minimum value of the band gap of the photoelectric conversion layer 13 appears is present in the intermediate region 13B, the portion at which the minimum value of the band gap appears in the thickness direction of the photoelectric conversion layer 13 and the portion at which the maximum value of the Ag concentration appears come close to each other. Therefore, in the present embodiment, the recombination of carriers is suppressed in the portion at which the minimum value of the band gap appears, which leads to improvement in the open circuit voltage and short circuit current of the photoelectric conversion element 10, and the efficiency of the photoelectric conversion of the photoelectric conversion layer 13 improves.

In addition, the Ag concentration of the photoelectric conversion layer 13 is preferably set to a concentration at which the band gap of the photoelectric conversion layer 13 is not substantially changed.

In a portion of the photoelectric conversion layer 13 to which a large amount of Ag is added, the band gap substantially expands. That is, when the Ag concentration is set to be high, the band gap of a region including the portion at which the minimum value of the band gap appears in the double graded structure tends to expand. In addition, depending on the Ag concentration profile, there is a likelihood that it is not possible for the photoelectric conversion layer 13 to obtain a desired band profile. For the above-described reason, the Ag concentration of the photoelectric conversion layer 13 in the present embodiment is preferably set to an extent that the band gap of the photoelectric conversion layer 13 is not substantially changed.

Therefore, in the present embodiment, the band gap of the photoelectric conversion layer 13 does not substantially expand compared with a case where Ag is not added, and it is possible to obtain a desired band profile that is the same as in a case where Ag is not added to the photoelectric conversion layer 13. Therefore, the efficiency of photoelectric conversion can be increased.

As an example, the maximum value of the Ag concentration in the photoelectric conversion layer 13 is preferably 0.00519 to 0.0140. In a case where the maximum value of the Ag concentration exceeds 0.0140, the band gap of the photoelectric conversion layer 13 substantially expands compared with a case where Ag is not added. On the other hand, in a case where the maximum value of the Ag concentration is smaller than 0.00519, the band gap does not substantially expand. However, in this case, it is difficult to sufficiently obtain an effect of increasing the carrier density of the photoelectric conversion layer 13 and an effect of reducing the recombination of carriers generated in the photoelectric conversion layer 13.

In addition, the portion at which the maximum value of the Ag concentration appears is preferably disposed closer to the light-receiving surface of the photoelectric conversion layer 13 than to the rear surface of the photoelectric conversion layer 13 in the thickness direction of the photoelectric conversion layer 13. In other words, when the entire photoelectric conversion layer 13 is equally divided into two parts of a light-receiving surface-side region and a rear surface-side region, the portion at which the maximum value of the Ag concentration appears is included in the light-receiving surface-side region in the photoelectric conversion layer 13 that has been equally divided into two parts. In the light-receiving surface-side region of the photoelectric conversion layer 13, a larger number of carriers are generated. Therefore, the above-described configuration significantly contributes to the suppression of the recombination of carriers compared with a case where the portion at which the maximum value of the Ag concentration appears is included in the rear surface-side region of the photoelectric conversion layer 13.

Similarly, the portion at which the maximum value of the Ag concentration appears is preferably disposed closer to the boundary of the intermediate region 13B on the light-receiving surface side than the boundary of the intermediate region 13B on the rear surface side in the thickness direction of the photoelectric conversion layer 13. In other words, when only the intermediate region 13B is equally divided into two parts of a light-receiving surface-side region and a rear surface-side region, the portion at which the maximum value of the Ag concentration appears is included in the light-receiving surface-side region in the intermediate region 13B that has been equally divided into two parts. In the intermediate region 13B as well, a larger number of carriers are generated in the light-receiving surface-side region. Therefore, the above-described configuration significantly contributes to the suppression of the recombination of carriers compared with a case where the portion at which the maximum value of the Ag concentration appears is included in the rear surface-side region of the intermediate region 13B.

In addition, in the thickness direction of the photoelectric conversion layer 13, the portion at which the maximum value of the Ag concentration appears in the photoelectric conversion layer 13 is preferably present in the rear surface side of the light-receiving surface with respect to the portion at which the minimum value of the band gap of the photoelectric conversion layer 13 appears. In such a case, the portion at which the maximum value of the Ag concentration appears in the photoelectric conversion layer 13 is disposed at a position at which the Ga concentration is high. As a result, an effect of suppressing an increase in an antisite defect $Ga_{Cu}$ due to the addition of Ag becomes strong in the portion of the photoelectric conversion layer 13 in which the amount of Ga is relatively large.

Meanwhile, the mole amount of Ag in the front surface-side region 13A is preferably set to 0.06 or less with respect to the mole amount of Ag contained in the entire photoelectric conversion layer 13. When the mole amount of Ag in the front surface-side region 13A is set to 0.06 or less of the total mole amount of Ag as described above, it is possible to further suppress the expansion of lattice mismatch in the interface between the photoelectric conversion layer 13 and the buffer layer 14 (or the second electrode layer 15) and to suppress an increase in the recombination of carriers.

In addition, the mole amount of Ag in the rear surface-side region 13C is preferably set to 0.19 or less with respect to the mole amount of Ag in the entire photoelectric conversion layer 13. When the mole amount of Ag in the rear surface-side region 13C is set to 0.19 or less of the total mole amount of Ag as described above, it is possible to further suppress an increase in the amount of S and an increase in the number of voids in the first electrode layer 12 side (the rear surface electrode side) of the photoelectric conversion layer 13. As a result, it is possible to suppress the degradation of adhesiveness between the photoelectric conversion layer 13 and the first electrode layer 12. In addition, it is possible to suppress an increase in the serial resistance Rs of the photoelectric conversion element 10 to which this photoelectric conversion layer 13 has been applied.

Furthermore, when the mole amounts of Ag in regions other than the intermediate region 13B in which Ag is effectively used (the front surface-side region 13A and the rear surface-side region 13C) are decreased, the efficiency of using Ag in the photoelectric conversion layer 13 increases, and the amount of Ag used can be reduced.

In addition, in the entire photoelectric conversion layer 13, Cu/III (non-Ag I/III) is smaller than one. In addition, the Cu/III of the front surface-side region 13A, which is the light-receiving surface-side region of the photoelectric conversion layer 13, may be more than one. Furthermore, the concentration profile of Cu/III of the photoelectric conversion layer 13 may increase from the rear surface side (substrate 11 side) toward the front surface side (light-receiving surface side) in the thickness direction.

Here, Cu/III indicates the ratio of the mole amount of Cu to the sum of the mole amounts of Group III elements in the photoelectric conversion layer 13. The Cu/III may be read as the ratio (non-Ag I/III) of the sum of the mole amounts of Group I elements other than Ag to the sum of the mole amounts of Group III elements.

The band gap of the photoelectric conversion layer obtained from the quantum efficiency of the photoelectric conversion element is preferably 1.04 eV to 1.20 eV.

Hereinafter, methods for measuring a variety of parameters regarding the photoelectric conversion layer 13 will be described.

In the above description, the concentration profile of an element in the photoelectric conversion layer 13 can be measured using a glow discharge optical emission spectrometry method while trimming the surface of a specimen using a sputtering method. The band gap profile of the photoelectric conversion layer 13 can be calculated from the concentration profile of an element that is obtained as described above. In addition, the band gap of the photoelectric conversion layer 13 is calculated from the absorption end of the quantum efficiency of the photoelectric conversion element 10 on the long wavelength side. Specifically, the change rate of the quantum efficiency on the long wavelength side with respect to wavelengths is calculated, and the energy at a wavelength at which the change rate is maximized is regarded as the band gap. The expression "band gap does not substantially change" means that the band gap calculated from the quantum efficiency of the photoelectric conversion element changes within a range of 1.5%.

(Buffer Layer 14)

The buffer layer 14 is disposed on the photoelectric conversion layer 13. The buffer layer 14 is, for example, an n-type or intrinsic (i)-type high-resistance conductive layer. Here, the expression "high-resistance" means that the conductive layer has a resistance value that is higher than the resistance value of the second electrode layer 15 described below.

The buffer layer 14 can be selected from compounds containing zinc (Zn), cadmium (Cd), or indium (In). Examples of the compound containing zinc include ZnO, ZnS, $Zn(OH)_2$, mixed crystals thereof such as Zn(O, S) and Zn(O, S, OH), furthermore, ZnMgO, ZnSnO, and the like. Examples of the compound containing cadmium include CdS, CdO, and mixed crystals thereof such as Cd(O, S) and Cd(O, S, OH). Examples of the compound containing indium include InS, InO, and mixed crystals such as In(O, S) and In(O, S, OH), and it is possible to use $In_2O_3$, $In_2S_3$, $In(OH)_x$, and the like.

In addition, the buffer layer 14 may have a stacked structure of these compounds. The thickness of the buffer layer 14 is set to 10 nm to 100 nm.

Here, the lattice constant of $Zn(O, S)_x$ is 4.28 Å (ZnO) to 5.41 Å (ZnS) depending on the ratio between O and S. The lattice constant of CdS is 5.82 Å.

Meanwhile, the lattice constants in the photoelectric conversion layer 13 are as described below, respectively. In Cu(Ga, In) $(Se, S)_2$, the lattice constant is 5.36 Å ($CuGaS_2$) to 5.78 Å ($CuInSe_2$) depending on the ratio among Ga, In, Se, and S. In Ag(Ga, In) $(Se, S)_2$, the lattice constant is 5.74 Å ($AgGaS_2$) to 6.09 Å ($AgInSe_2$) depending on the ratio among Ga, In, Se, and S. As in the present embodiment, when Ag is added to Cu(Ga, In) $(Se, S)_2$, the lattice constant expands.

Therefore, particularly, in a case where the buffer layer 14 is $Zn(O, S)_x$, the difference in lattice constant (lattice mismatch) between the photoelectric conversion layer 13 and the buffer layer 14 increases as the amount of Ag increases. Therefore, the mole amount of Ag that is contained in the buffer layer 14-side region of the photoelectric conversion layer 13 (that is, the front surface-side region 13A of the photoelectric conversion layer 13) or the Ag concentration on the outermost surface of the photoelectric conversion layer 13 on the buffer layer 14 side (the outermost surface of the front surface-side region 13A) is preferably as small as possible.

Meanwhile, in a case where the buffer layer 14 is CdS, the lattice constant of Cu(Ga, In) (Se, S)$_2$ that contains Ag due to the addition of Ag approximates to the lattice constant of the buffer layer 14.

The buffer layer 14 has an effect of improving characteristics such as the photoelectric conversion efficiency, but is also allowed not to be provided. In a case where the buffer layer 14 is not provided, the second electrode layer 15 which will be described below is disposed on the photoelectric conversion layer 13.

(Second Electrode Layer 15)

The second electrode layer 15 is disposed on the buffer layer 14. The second electrode layer 15 is, for example, an n-type conductive layer. The second electrode layer 15 preferably contains, for example, a material having a broad band gap and a sufficiently low resistance value. In addition, the second electrode layer 15 serves as a passage for light such as solar light and thus preferably has a property of transmitting light having wavelengths that can be absorbed by the photoelectric conversion layer 13. For this reason, the second electrode layer 15 is referred to as a transparent electrode layer or a window layer.

The second electrode layer 15 contains, for example, a metal oxide to which a Group III element (B, Al, Ga, or In) has been added as a dopant. Examples of the metal oxide include ZnO and SnO$_2$. The second electrode layer 15 can be selected from, for example, indium tin oxide (ITO), indium titanium oxide (ITiO), indium zinc oxide (IZO), zinc tin oxide (ZTO), fluorine-doped tin oxide (FTO), gallium-doped zinc oxide (GZO), and the like. The thickness of the second electrode layer 15 is set to 0.5 µm to 2.5 µm.

<Method for Manufacturing Photoelectric Conversion Element>

Next, an example of a method for manufacturing the photoelectric conversion element 10 shown in FIG. 1 will be described.

(Formation of First Electrode Layer 12)

Figure 3:
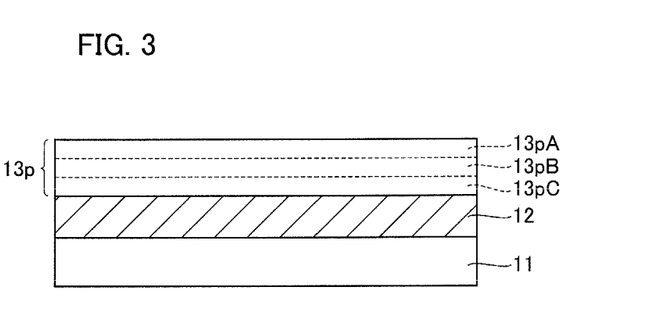
FIG. 3 is a cross-sectional view showing a step of a method for manufacturing a photoelectric conversion element.

First, as shown in FIG. 3, the first electrode layer 12 is formed on the substrate 11 by, for example, a sputtering method. The sputtering method may be a direct current (DC) sputtering method or a radio frequency (RF) sputtering method. In addition, the first electrode layer 12 may also be formed using a chemical vapor deposition (CVD) method, an atomic layer deposition (ALD) method, or the like in place of the sputtering method.

(Formation of Precursor Layer 13p)

Subsequently, a precursor layer 13p containing Group I elements and Group III elements is formed on the first electrode layer 12 (refer to FIG. 3).

Examples of a method for forming the precursor layer 13p include the above-described sputtering method, an evaporation method, and an ink coating method. The evaporation method is a method in which a film is formed using an atom or the like that has become a gas phase by heating an evaporation source. The ink coating method is a method in which a powder-form material for a precursor film is dispersed in a solvent such as an organic solvent, the solution is applied onto the first electrode layer 12, and then the solvent is evaporated to form the precursor layer 13p.

In the present embodiment, the precursor layer 13p contains Ag. The Group I elements other than Ag that is contained in the precursor layer 13p can be selected from copper, gold, and the like, and the Group III elements that is contained in the precursor layer 13p can be selected from indium, gallium, aluminum, and the like. In addition, the precursor layer 13p may contain alkali metal such as Li, Na, K, Rb, or Cs. In addition, the precursor layer 13p may contain, as the Group VI elements, in addition to selenium and sulfur, tellurium (Te).

The precursor layer 13p has three regions of a front surface-side region 13pA, an intermediate region 13pB, and a rear surface-side region 13pC in the thickness direction (the vertical direction in the drawing). The front surface-side region 13pA, the intermediate region 13pB, and the rear surface-side region 13pC in the precursor layer 13p can be obtained by stacking films that are formed using the above-described sputtering method or evaporation method.

In addition, among the three regions of the precursor layer 13p, a layer containing the largest amount of Ag is present in the intermediate region 13pB.

Examples of a method for forming the layer containing Ag in the precursor layer 13p include a method in which a thin film (layer) is formed by the sputtering method or the evaporation method using a sputtering source or evaporation source containing Ag (Ag target or Ag evaporation source).

In addition, in the case of forming the precursor layer 13p by the sputtering method in which a plurality of sputtering sources is used, it is possible to form a region containing Ag at a desired position in the precursor layer 13p by combining a sputtering source containing Ag (Ag target or the like) and a sputtering source containing no Ag. Similarly, in the case of forming the precursor layer 13p by the evaporation method in which a plurality of evaporation sources is used, it is possible to form a region containing Ag at a desired position in the precursor layer 13p by combining an evaporation source containing Ag (Ag evaporation source or the like) and an evaporation source containing no Ag.

In the case of forming the precursor layer 13p using a plurality of sputtering sources or a plurality of evaporation sources, the mole amount of Ag in the precursor layer 13p can be adjusted using the ratio between the film amounts (mole amounts) in the layer containing Ag and in the layer containing no Ag and/or the amounts of Ag added to the sputtering sources or evaporation sources.

In addition, examples of a method for disposing the layer containing the largest amount of Ag in the intermediate region 13pB of the precursor layer 13p include the following methods.

For example, in a case where the precursor layer 13p is configured to include a Cu film, a Ga film, and an In film stacked in order from the substrate 11 side, the layer containing the largest amount of Ag may be disposed between the Cu film and the Ga film or between the Ga film and the In film. In addition, in a case where the precursor layer 13p is configured to include a Cu—Ga film and an In film stacked in order from the substrate 11 side, the layer containing the largest amount of Ag may be disposed between the Cu—Ga film and the In film. A Cu—Ga layer containing no Ag may be further included between a Cu—Ga layer containing Ag and an In layer.

In addition, the layer containing the largest amount of Ag in the precursor layer 13p is not disposed on the outer surface of the precursor layer 13p that is positioned on the uppermost side in FIG. 3 and is also not disposed on the boundary surface between the first electrode layer 12 and the precursor layer 13p.

Therefore, when the precursor layer 13p has been turned into a chalcogenide to form the photoelectric conversion layer 13, the portion at which the maximum value of the Ag concentration appears is included in the intermediate region 13B of the photoelectric conversion layer 13. Therefore, in the photoelectric conversion layer 13 after the chalcogenization, it is possible to increase the Ag concentration to be higher in the intermediate region 13B than in the front surface-side region 13A and in the rear surface-side region 13C. In other words, in the photoelectric conversion layer 13 after the chalcogenization, the Ag concentration becomes lower in any of the front surface-side region 13A and the rear surface-side region 13C than in the intermediate region 13B.

In addition, when the film amount (mole amount) in the precursor layer 13p is equally divided into two parts of a light-receiving surface-side region and a rear surface-side region, the mole amount of Ag contained in the light-receiving surface-side region preferably becomes large. In such a case, in a case where the photoelectric conversion layer 13 after the chalcogenization is equally divided into two parts of a light-receiving surface-side region and a rear surface-side region, the portion at which the maximum value of the Ag concentration appears in the photoelectric conversion layer 13 is included in the light-receiving surface-side region.

Similarly, when the film amount in the intermediate region 13pB of the precursor layer 13p is equally divided into two parts of a light-receiving surface-side region and a rear surface-side region, the mole amount of Ag contained in the light-receiving surface-side region preferably becomes large. In such a case, in a case where the intermediate region 13B of the photoelectric conversion layer 13 after the chalcogenization is equally divided into two parts of a light-receiving surface-side region and a rear surface-side region, the portion at which the maximum value of the Ag concentration appears in the intermediate region 13B is included in the light-receiving surface-side region.

In the entire precursor layer 13p, the ratio (Cu/III) between the mole amounts of Cu and the Group III elements is less than 1.0. From the viewpoint of further increasing the efficiency of photoelectric conversion, the Cu/III is preferably within a range of 0.86 to 0.98 and, furthermore, more preferably within a range of 0.91 to 0.96.

(Chalcogenization Treatment of Precursor Layer 13p)

Figure 4:
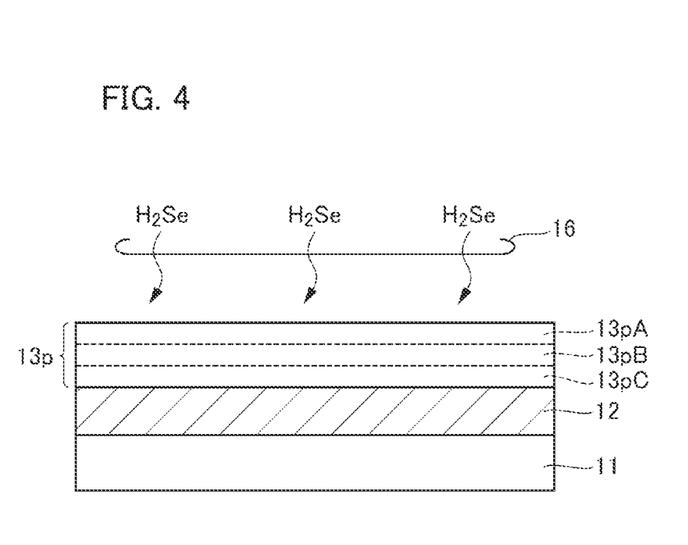
FIG. 4 is a cross-sectional view showing a step of a method for manufacturing a photoelectric conversion element.

Next, the precursor layer 13p is turned into a chalcogenide by a heat treatment in an atmosphere containing a Group VI element, thereby forming the photoelectric conversion layer 13.

First, as shown in FIG. 4, for example, selenization is performed by a gas-phase selenization method. The selenization is performed by heating the precursor layer 13p in an atmosphere of a selenium source gas containing selenium as a Group VI element source (for example, hydrogen selenide or selenium vapor) 16. While not particularly limited, the selenization is preferably performed, for example, at a temperature within a range of 300° C. or higher and 600° C. or lower in a heating furnace.

As a result, the precursor layer 13p is converted into a compound containing the Group I elements, the Group III elements, and selenium (photoelectric conversion layer 13).

The compound containing the Group I elements, the Group III elements, and selenium (photoelectric conversion layer 13) may be formed by a method other than the gas-phase selenization method. For example, such a compound can also be formed by a solid-phase selenization method, an evaporation method, an ink coating method, an electrodeposition method, or the like.

Figure 5:
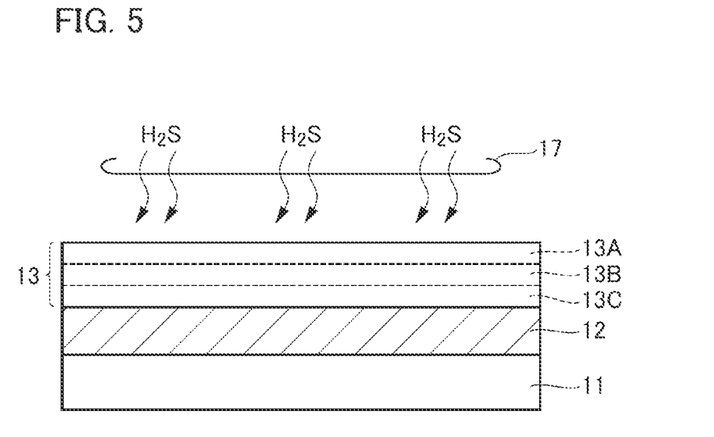
FIG. 5 is a cross-sectional view showing a step of a method for manufacturing a photoelectric conversion element.

Next, as shown in FIG. 5, sulfurization of the photoelectric conversion layer 13 containing the Group I elements, the Group III elements, and selenium is performed. The sulfurization is performed by heating the photoelectric conversion layer 13 in an atmosphere of a sulfur source gas containing sulfur (for example, hydrogen sulfide or sulfur vapor) 17. As a result, the photoelectric conversion layer 13 is converted into a compound containing the Group I elements, the Group III elements, and selenium and sulfur as Group VI elements. The sulfur source gas 17 assumes a role of substituting selenium in crystals made up of the Group I elements, the Group III elements, and selenium, for example, chalcopyrite crystals into sulfur in the surface portion of the photoelectric conversion layer 13.

While not particularly limited, the sulfurization is preferably performed, for example, at a temperature within a range of 450° C. or higher and 650° C. or lower in a heating furnace.

When the selenization and sulfurization of the precursor layer 13p are performed as described above, a double graded structure in which the minimum value of the band gap is brought to the inside of the photoelectric conversion layer in the thickness direction is formed according to the concentration profiles of Ga and S in the photoelectric conversion layer 13 to be formed.

The photoelectric conversion layer 13 has the front surface-side region 13A, the intermediate region 13B, and the rear surface-side region 13C in order from the light-receiving surface side. The portion at which the minimum value of the band gap of the photoelectric conversion layer 13 appears and the portion at which the maximum value of the Ag concentration of the photoelectric conversion layer 13 appears are both included in the intermediate region 13B.

(Formation of Buffer Layer 14 and Second Electrode Layer 15)

Figure 6:
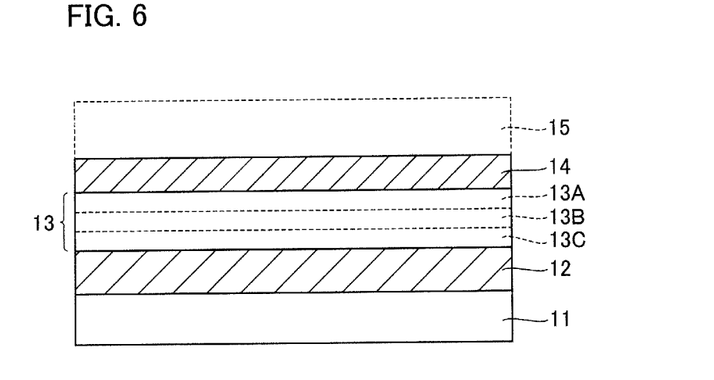
FIG. 6 is a cross-sectional view showing a step of a method for manufacturing a photoelectric conversion element.

As shown in FIG. 6, the buffer layer 14 is formed on the photoelectric conversion layer 13 by a method such as a chemical bath deposition (CBD) method or a sputtering method. In addition, the second electrode layer 15 that is indicated by the broken line in FIG. 6 is formed on the buffer layer 14 by a method such as a sputtering method, a CVD method, or an ALD method. The second electrode layer 15 may be directly formed on the photoelectric conversion layer 13 without providing the buffer layer 14.

The photoelectric conversion element 10 shown in FIG. 1 is completed with the above-described steps.

Example

Hereinafter, an example of the photoelectric conversion element of the present invention will be described.

(Regarding Element Concentration Composition and Band Gap of Photoelectric Conversion Layer)

Figure 7A:
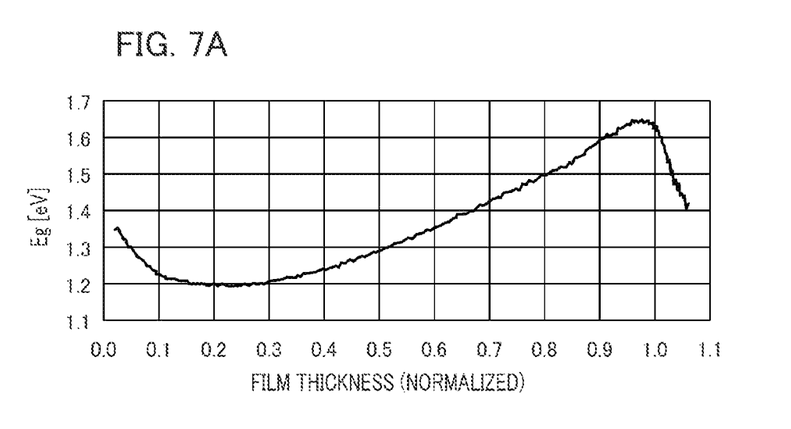
FIG. 7(A) is a graph showing a profile of a band gap (Eg) of a photoelectric conversion layer of an example.
Figure 7B:
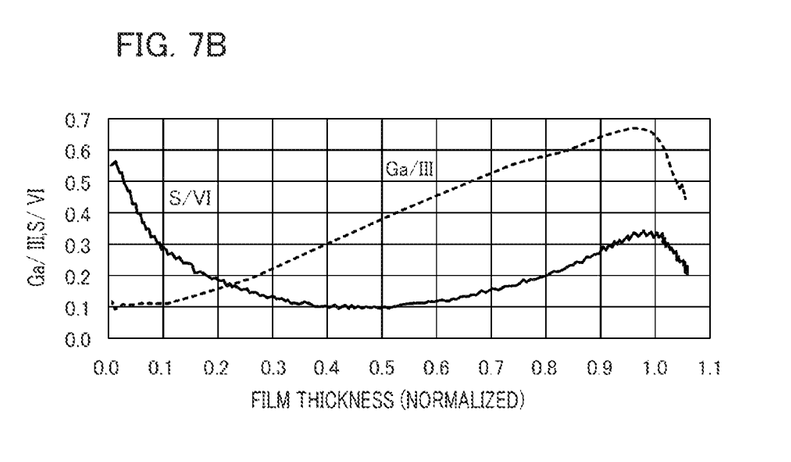
FIG. 7(B) and FIG. 7(C) are graphs showing profiles of element concentration composition ratios of the photoelectric conversion layer of the example.
Figure 7C:
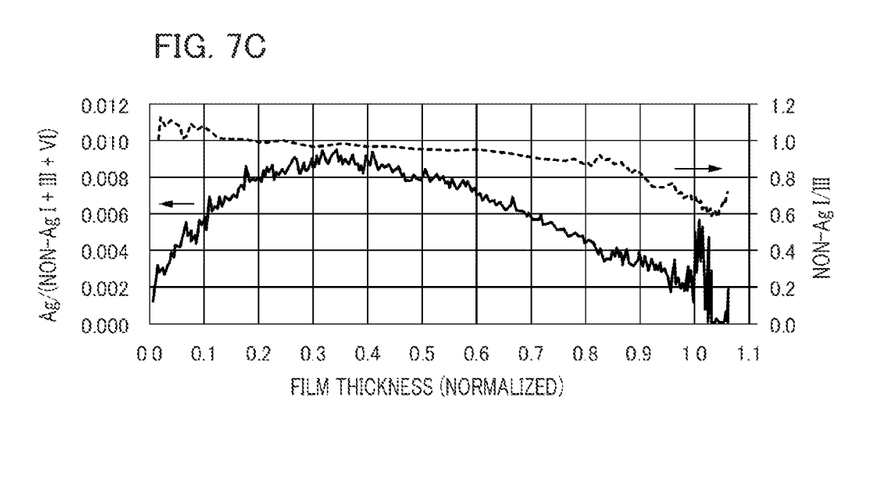

FIG. 7(A) shows the profile of the band gap (Eg) of a photoelectric conversion layer in a photoelectric conversion element of the example. FIG. 7(B) and FIG. 7(C) show graphs of the profiles of the element concentration composition ratios of the photoelectric conversion layer of the example. The band gap in FIG. 7(A) is calculated from the element concentration composition of the photoelectric conversion layer.

In each drawing of FIG. 7, the horizontal axis indicates the normalized film thickness of the photoelectric conversion layer, and '0' and '1.0' correspond to the interface on the light-receiving surface side (the front surface of the photoelectric conversion layer) and the interface on the substrate side (the rear surface of the photoelectric conversion layer), respectively. The vertical axis in FIG. 7(A) indicates the band gap (Eg).

The vertical axis in FIG. 7(B) indicates the mole amount ratio (Ga/III) of Ga to Group III elements for the broken-line profile in the drawing and indicates the mole amount ratio (S/VI) of S to Group VI elements for the solid-line profile in the drawing.

The vertical axis in FIG. 7(C) indicates the mole amount ratio (non-Ag I/III, for example, Cu/III) of Group I elements other than Ag to Group III elements for the broken-line profile in the drawing (refer to the right-side vertical axis in FIG. 7(C)). In addition, the vertical axis in FIG. 7(C) indicates the Ag concentration (Ag/non-Ag I+III+VI) for the solid-line profile in the drawing (refer to the left-side vertical axis in FIG. 7(C)).

As shown by the solid line in FIG. 7(B), the profile in the thickness direction of S/VI of the photoelectric conversion layer exhibits high values on the front surface side. Similarly, as shown by the broken line in FIG. 7(B), the profile in the thickness direction of Ga/III of the photoelectric conversion layer forms a shape in which the value increases from the front surface side toward the rear surface side.

Due to the above-described increase in S/VI on the front surface side of the photoelectric conversion layer and the above-described increase in Ga/III on the rear surface side, the band gap profile of the photoelectric conversion layer shown in FIG. 7(A) forms a shape that becomes convex downward. That is, the band gap profile exhibits a double graded structure in which the value is large on the front surface side and on the rear surface side and the value is small in the region therebetween, and, as shown in FIG. 7(A), the band gap has the minimum value at a position near a film thickness of 0.2 from the front surface side.

As shown by the broken line in FIG. 7(C), the profile in the thickness direction of Cu/III (non-Ag I/III) of the photoelectric conversion layer forms a shape in which the value increases from the rear surface side toward the front surface side. In addition, the value of Cu/III shown by the broken line in FIG. 7(C) exceeds 1 in a region within a range of 0.18 or less of the film thickness from the front surface side.

The average value of the Ag concentration (Ag/(non-Ag I+III+VI)) in the photoelectric conversion layer is 0.0062. This average value of the Ag concentration is a value obtained by integrating the Ag concentrations of the photoelectric conversion layer in the thickness direction and averaging the integrated Ag concentrations. As shown by the solid line in FIG. 7(C), the maximum value of the Ag concentration is 0.0091 and is within a film thickness range of 0.3 to 0.4.

(Regarding Amount of Ag in Each Region of Photoelectric Conversion Layer)

Next, the mole amount of Ag (amount of Ag) in each region in the photoelectric conversion layer of the example will be described with reference to Table 1.

Table 1 shows the proportions of the amount of Ag that is contained in each region in the total amount of Ag with different film thickness ranges of an intermediate region in the case of dividing the photoelectric conversion layer of the photoelectric conversion element into a front surface-side region, the intermediate region, and a rear surface-side region in order from the light-receiving surface side. The film thickness ranges in Table 1 are indicated by normalized film thicknesses, and '0' and '1.0' correspond to the interface on the light-receiving surface side (the front surface of the photoelectric conversion layer) and the interface on the substrate side (the rear surface of the photoelectric conversion layer), respectively.

TABLE 1

| | Film thickness range of intermediate region | Proportion of Ag amount in front surface-side region | Proportion of Ag amount in intermediate region | Proportion of Ag amount in rear surface-side region |
|---|---|---|---|---|
| (a) | 0.05 to 0.80 | 2% | 87% | 11% |
| (b) | 0.085 to 0.75 | 5% | 80% | 15% |
| (c) | 0.10 to 0.70 | 6% | 75% | 19% |
| (d) | 0.138 to 0.60 | 10% | 60% | 30% |
| (e) | 0.15 to 0.60 | 11% | 59% | 30% |
| (f) | 0.18 to 0.515 | 15% | 45% | 40% |
| (g) | 0.20 to 0.50 | 17% | 41% | 42% |

For example, in a case where the intermediate region of the photoelectric conversion layer was defined as a region within a range of 0.1 to 0.7 of the film thickness from the front surface side of the photoelectric conversion layer, the amount of Ag that was contained in the intermediate region was 75%, the amount of Ag that was contained in the front surface-side region was 6%, and the amount of Ag that was contained in the rear surface-side region was 19% (refer to (c) in Table 1). The portion at which the minimum value of the band gap of the photoelectric conversion layer appears and the portion at which the maximum value of the Ag concentration appears are both present in the intermediate region.

From (f) in Table 1, it is found that the film thickness of the front surface-side region in which the amount of Ag that is contained in the front surface-side region reaches 15% or less is within a range of 0.18 or less from the front surface side. In addition, from (d) and (e) in Table 1, it is found that the film thickness of the rear surface-side region in which the amount of Ag that is contained in the rear surface-side region reaches 30% or less is within a range of 0.6 or more from the front surface side.

In all settings of the intermediate region shown in (a) to (g) in Table 1, the position of the portion at which the maximum value of the Ag concentration appears in the film thickness direction is in the rear surface side with respect to the position of the portion at which the minimum value of the band gap of the photoelectric conversion layer appears in the film thickness direction.

(Regarding Characteristics of Photoelectric Conversion Element Depending on Addition of Ag)

Next, differences in the characteristics of the photoelectric conversion element depending on the addition of Ag to the photoelectric conversion layer will be described with reference to Table 2. The example corresponds to a photoelectric conversion element in a case where Ag was added, and a comparative example corresponds to a photoelectric conversion element in a case where Ag was not added. Each characteristic value of the example in Table 2 is a value normalized based on the characteristic value of the comparative example.

Eff indicates the photoelectric conversion efficiency, $V_{OC}$ indicates the open circuit voltage, $I_{SC}$ indicates the short circuit current, and FF indicates the fill factor.

TABLE 2

|  | Addition of Ag | Normalized Eff | Normalized Voc | Normalized Isc | Normalized FF |
|---|---|---|---|---|---|
| Comparative Example | No | 1.000 | 1.000 | 1.000 | 1.000 |
| Example | Yes | 1.055 | 1.033 | 1.001 | 1.018 |

The average value of the Ag concentration of the photoelectric conversion layer in the example is 0.00655. In the example, the addition of Ag improved $V_{OC}$ (decreased the $V_{OC}$ deficit) and also improved FF compared with the comparative example. In the example, it is considered that the recombination of carriers generated in the front surface-side region and the intermediate region of the photoelectric conversion layer was suppressed, which led to the improvement of $V_{OC}$ and the improvement of FF.

Next, a change in the photoelectric conversion efficiency depending on the amount of Ag added to the photoelectric conversion layer will be described with reference to Table 3.

In Table 3, the average values and the maximum values of the Ag concentration (Ag/(non-Ag I+III+VI)) and the Eff values of the comparative example corresponding to a photoelectric conversion element to which Ag was not added and a photoelectric conversion element to which Ag was added are comparatively shown, respectively. In Table 3, the values of the comparative example are shown in the first column on the left side of the table. The Eff values are normalized based on the Eff value of the comparative example in which Ag was not added. In addition, the average value and the maximum value of the Ag concentration of the comparative example are both zero since Ag was not added in the comparative example.

TABLE 3

| Average value of Ag/ (non-Ag I + III + VI) | 0 | 0.00355 | 0.00722 | 0.00961 |
|---|---|---|---|---|
| Maximum value of Ag/ (non-Ag I + III + VI) | 0 | 0.00519 | 0.0105 | 0.0140 |
| Normalized Eff | 1.000 | 1.020 | 1.031 | 1.015 |

As shown in Table 3, the improvement of the conversion efficiency of the photoelectric conversion element was admitted with the average value of the Ag concentration within a range of 0.00355 to 0.00961 or the maximum value of the Ag concentration within a range of 0.00519 to 0.00140.

(Regarding Quantum Efficiency of Photoelectric Conversion Layer and Wavelength Dependency of Change in Quantum Efficiency)

Figure 8:
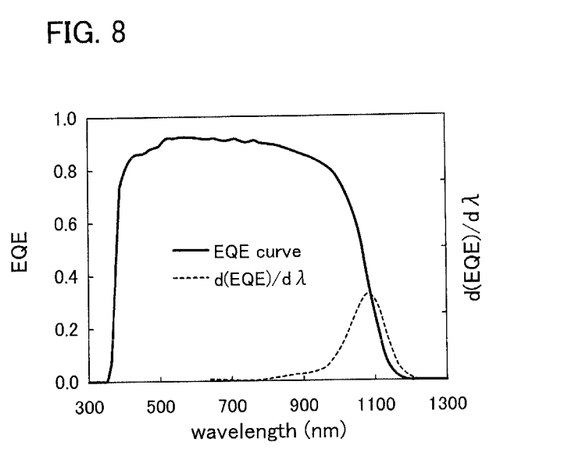
FIG. 8 is a graph showing a quantum efficiency of a photoelectric conversion element having a photoelectric conversion layer to which Ag has been added and a wavelength dependency of a change in the quantum efficiency.

FIG. 8 is a graph showing the quantum efficiency of the photoelectric conversion element in which Ag was added to the photoelectric conversion layer and the wavelength dependency of a change in the quantum efficiency. The solid line in the drawing indicates the curve of the quantum efficiency (EQE), and the broken line in the drawing is the curve of the differential value of the quantum efficiency with respect to the differential value of the wavelength (d(EQE)/dλ) and indicates the wavelength dependency of a change in the quantum efficiency.

The energy at the wavelength at which the change rate of the quantum efficiency with respect to the wavelength became the maximum value in the long wavelength-side region of the quantum efficiency was defined as the band gap (Eg) of the photoelectric conversion layer. Eg of the photoelectric conversion layer to which Ag was added was not substantially different from Eg of the photoelectric conversion layer to which Ag was not added.

(Regarding Change in Correlation Between Eg and $V_{OC}$ Deficit Depending on Addition of Ag)

Figure 9:
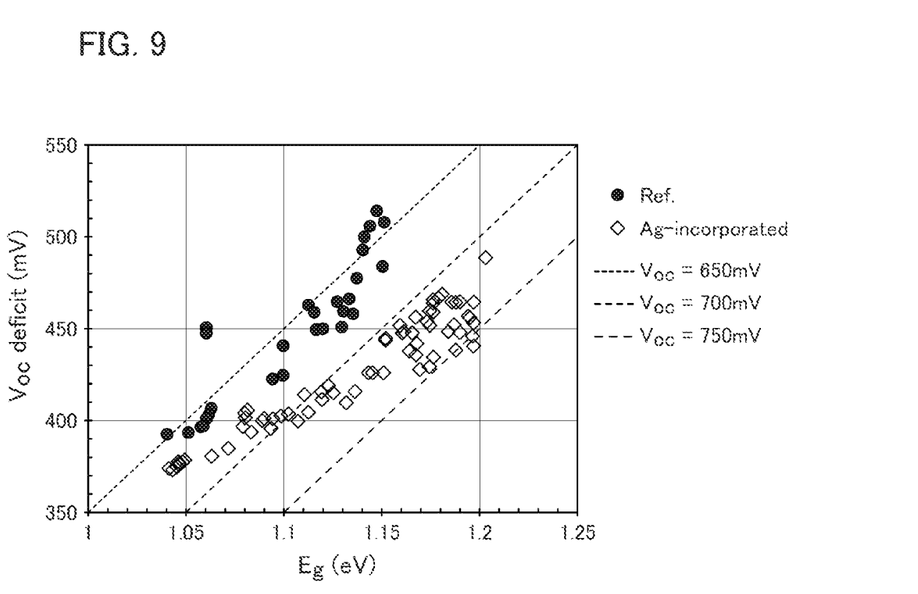
FIG. 9 is a graph showing a change in a correlation between a band gap and an open circuit voltage deficit depending on the addition of Ag.

FIG. 9 is a graph showing a change in the correlation between the band gap and the open circuit voltage deficit depending on the addition of Ag.

The horizontal axis of FIG. 9 indicates the band gap (Eg) of the photoelectric conversion layer in the photoelectric conversion element. The vertical axis of FIG. 9 indicates the $V_{OC}$ deficit that is obtained from the difference between Eg and $V_{OC}$ of the photoelectric conversion element. In the graph of FIG. 9, the output results based on the photoelectric conversion layer of the comparative example to which Ag was not added are indicated by "Ref (●)", and the output results based on the photoelectric conversion layer of the example to which Ag was added are indicated by "Ag-incorporated (◇)".

Regarding Ref. in FIG. 9, as Eg of the photoelectric conversion layer increases, the $V_{OC}$ deficit also increases. The distribution of the $V_{OC}$ deficit of Ref is approximately along the line of $V_{OC}$=650 mV. That is, it is found that, in Ref., there is no significant improvement in $V_{OC}$ even when Eg of the photoelectric conversion layer increases.

On the other hand, in the photoelectric conversion layer of the example in which Ag was added, as Eg of the photoelectric conversion layer increases, the $V_{OC}$ deficit also increases, but there is a tendency that the degree of the increase in the $V_{OC}$ deficit generally becomes smaller than the degree of the increase in Eg of the photoelectric conversion layer. That is, it is found that, in the photoelectric conversion layer of the example in which Ag was added, $V_{OC}$ improves as Eg of the photoelectric conversion layer increases.

The characteristics of the photoelectric conversion element are more favorable as the $V_{OC}$ deficit is smaller ($V_{OC}$ is larger) with respect to a specific Eg of the photoelectric conversion layer. Specifically, it is considered that Ag added to the photoelectric conversion layer is capable of suppressing an antisite defect $In_{Cu}$, which increases the carrier density in the photoelectric conversion layer and reduces the recombination of carriers generated in the photoelectric conversion element. Particularly, it is considered that the recombination of carriers in the vicinity of the portion at which the minimum value of the band gap of the photoelectric conversion layer appears is suppressed, which leads to improvement in the open circuit voltage and short circuit current of the photoelectric conversion element. In addition, since the amount of Ag added to the front surface-side region of the photoelectric conversion layer is small, it is considered that the expansion of lattice mismatch in the interface between the photoelectric conversion layer and the buffer layer attributed to the addition of Ag can be suppressed, and an increase in the recombination of carriers can be suppressed.

The above-described effects were obtained by adding Ag to the photoelectric conversion layer of the photoelectric conversion element with Eg of the photoelectric conversion layer within a range of 1.04 eV to 1.15 eV. In addition, even with Eg of the photoelectric conversion layer in a range of more than 1.15 eV to 1.20 eV (no Ref data), effects that can be considered as the above-described effects were obtained. In the experiment of FIG. 9, Eg of the photoelectric conversion layer was adjusted with the conditions (the temperature, the gas concentration, and the like) for forming the photoelectric conversion layer. The change in Eg of the photoelectric conversion layer results from a change in the amount of Ga in the intermediate region. In a case where Eg of the photoelectric conversion layer became large, the amount of Ga in the intermediate region increased.

In addition, when Eg of the photoelectric conversion layer was large, the $V_{OC}$ deficit-reducing ($V_{OC}$-improving) effect was strong. This is considered that, when the amount of Ga in the photoelectric conversion layer was large, the number of antisite defects $Ga_{cu}$ increased, and, consequently, in the photoelectric conversion layer in which the amount of Ga was relatively large, the effect of suppressing an increase in the number of the antisite defects $Ga_{cu}$ due to the addition of Ag became strong.

(Manufacturing Examples of Photoelectric Conversion Layer)

Next, manufacturing examples of the photoelectric conversion layer will be described.

In the manufacturing examples, a first electrode layer containing molybdenum was formed on a substrate that was a glass plate by a sputtering method. Next, a Gu-Ga sputtering target and an In sputtering target were sputtered, thereby forming a precursor on the first electrode layer.

In the manufacturing examples, as the Cu—Ga target, a target not containing Ag and a target containing Ag were prepared, and a Cu—Ga layer not containing Ag and a Cu—Ga layer containing Ag were formed by combining both targets. For a first layer in the precursor (a layer including a first surface on the first electrode layer side), the Cu—Ga target not containing Ag was used. For the subsequent Cu—Ga layer, the Cu—Ga target containing Ag was used. An In layer was formed on the plurality of Cu—Ga layers.

In the manufacturing examples of the present example, the Cu—Ga layer containing Ag becomes a precursor sandwiched between the Cu—Ga layer not containing Ag and the In layer. That is, the precursor includes a layer containing at least Cu, a layer containing at least one of In and Ga, and a layer containing Ag. In addition, the precursor has a first surface on the first electrode layer side and a second surface on a second electrode layer side, and the layer containing Ag is present between a layer including the first surface of the precursor and a layer including the second surface.

The Cu/(In+Ga) of the precursor in the manufacturing examples is 0.94. The ratio (Cu/III) of the number of atoms of Cu to Group III elements in the entire precursor is lower than 1.0.

In addition, the precursor was turned into a chalcogenide to form a photoelectric conversion layer. After that, a buffer layer and the second electrode layer were formed.

Table 4 shows the characteristics of the photoelectric conversion elements resulting from differences in the stacking configuration of the precursor in the photoelectric conversion element. The configurations of the precursors in the manufacturing examples are as described below.

Example 1: Cu—Ga/Cu—Ga (Ag added)/In from the first electrode layer side

Example 2: Cu—Ga/Cu—Ga (Ag added)/Cu-Ga/In from the first electrode layer side

Comparative Example: Cu—Ga/In from the first electrode layer side

TABLE 4

| Condition | Normalized Eff | Normalized $V_{OC}$ | Normalized $I_{SC}$ | Normalized FE | Normalized Rs | Normalized Rsh |
|---|---|---|---|---|---|---|
| Example 1 | 1.055 | 1.033 | 1.001 | 1.018 | 1.035 | 1.085 |
| Example 2 | 0.994 | 1.014 | 1.005 | 0.974 | 1.051 | 0.895 |
| Comparative Example | 1.000 | 1.000 | 1.000 | 1.000 | 1.000 | 1.000 |

Table 4 shows the characteristic values of Example 1 and Example 2 that are normalized based on the characteristic values of the comparative example in which Ag was not added, respectively. In addition, the average values of the Ag concentrations in Example 1 and Example 2 are 0.00655. Eff, $V_{OC}$, $I_{SC}$, and FF in Table 4 are the same as in Table 2, Rs indicates the series resistance, and Rsh indicates the parallel resistance.

When, between regions obtained by equally dividing the mole amount (number of atoms) of an element in the precursor into two parts in the film thickness direction, the region on the first electrode layer side was defined as a first region, and the region on the second electrode layer side was defined as a second region, in Example 1, the amount of Ag in the second region was larger than the amount of Ag in the first region. In Example 2, the amount of Ag in the second region was smaller than the amount of Ag in the first region.

In Example 1 shown in Table 4, $V_{OC}$ improved (the $V_{OC}$ deficit decreased), and FF also improved. Particularly, it is considered that the recombination of carriers generated in the front surface-side region and the intermediate region of the photoelectric conversion layer was suppressed, which led to the improvement of $V_{OC}$ and the improvement of FF.

<Application Examples of Photoelectric Conversion Element>

Figure 10:
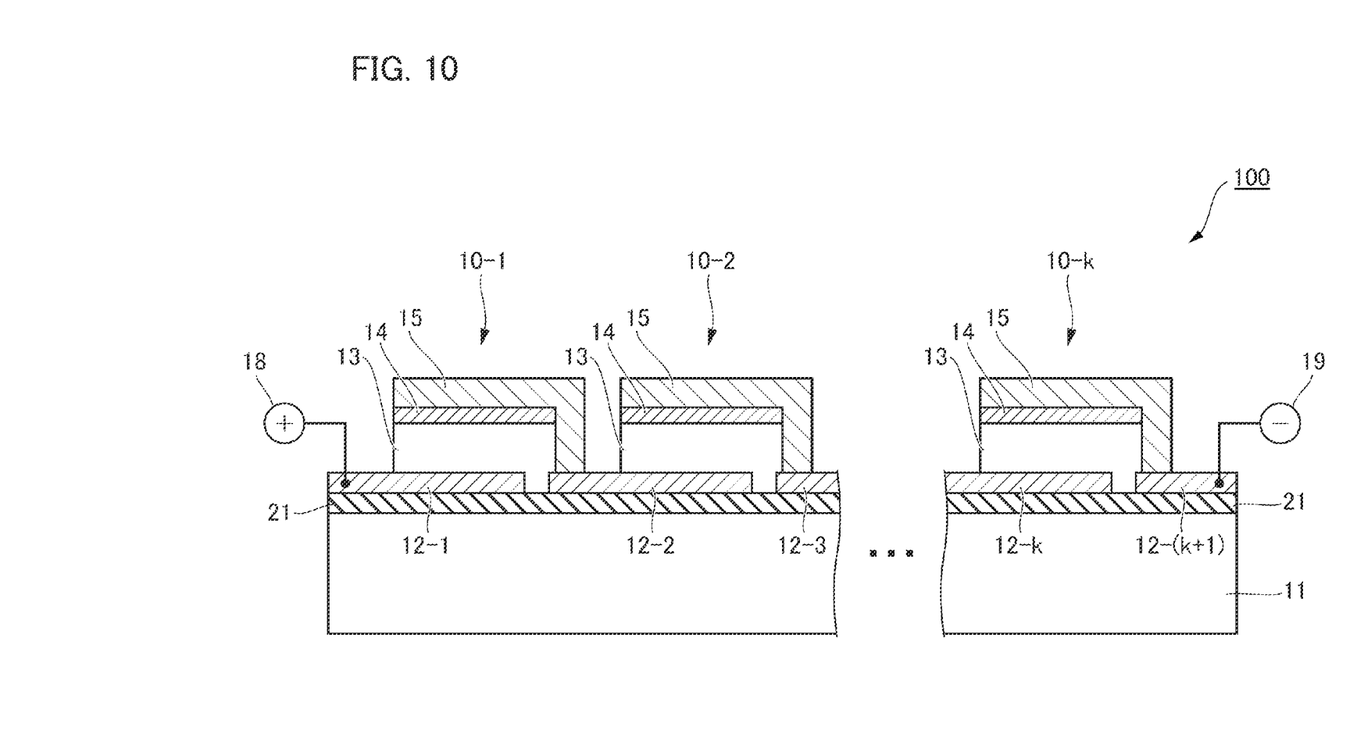
FIG. 10 is a view showing an example of a solar cell submodule to which the photoelectric conversion element has been applied.

FIG. 10 is an example of a solar cell submodule as an application example of the photoelectric conversion element of the present invention.

A solar cell submodule 100 shown in FIG. 10 has a so-called integration-type structure. That is, the solar cell submodule 100 includes a plurality of photoelectric conversion elements 10-1, 10-2, . . . 10-k that is connected in series. Here, k is a natural number of two or larger.

A substrate 11 is shared by the plurality of photoelectric conversion elements 10-1, 10-2, . . . 10-k. The substrate 11 is, for example, a flexible substrate having a stacked structure of stainless steel (SUS), aluminum, and aluminum oxide. An insulating layer 21 is formed on the substrate 11. The insulating layer 21 is, for example, a coating of aluminum oxide, glass frit, or the like.

A plurality of first electrode layers 12-1, 12-2, . . . 12-k, 12-(k+1) is disposed side by side on the insulating layer 21 of the substrate 11.

Each of the photoelectric conversion elements 10-1, 10-2, ... 10-k has a photoelectric conversion layer 13 and a buffer layer 14. The photoelectric conversion layer 13 and the buffer layer 14 correspond to the photoelectric conversion layer 13 and the buffer layer 14 of the photoelectric conversion element 10 shown in FIG. 1.

In each of the photoelectric conversion elements 10-1, 10-2, ... 10-k, a second electrode layer 15 is connected to one of the plurality of first electrode layers 12-1, 12-2, ... 12-k. For example, the second electrode layer 15 in the photoelectric conversion element 10-1 is connected to the first electrode layer 12-2 in the photoelectric conversion element 10-2 that is positioned adjacent to the photoelectric conversion element 10-1. This is also true for the remaining photoelectric conversion elements 10-2, ... 10-k. As a result, the plurality of photoelectric conversion elements 10-1, 10-2, ... 10-k is connected to each other in series.

The first electrode layer 12-1 is connected to, for example, a positive electrode 18, and the first electrode layer 12-(k+1) is connected to, for example, a negative electrode 19.

Here, in the solar cell submodule 100, in order to resolve the initial insulation defect of the insulating layer 21, a test in which a voltage is applied between the conductive substrate 11 and the first electrode layer 12 after the formation of the photoelectric conversion element 10 is performed in manufacturing steps.

As the method for applying the voltage, the voltage is raised from 0 V, and the upper limit voltage is, for example, a hundred and several tens of volts. The upper limit voltage is appropriately adjusted with the film thickness of the insulating layer 21 or the number of the photoelectric conversion elements connected in series.

In a case where there is an initial insulation defect, the application of a voltage between the substrate 11 and the first electrode layer 12 conducts electricity. In the above-described test of the solar cell submodule 100, the voltage is raised from 0 V until an open state is formed. Once an open state is formed, the resistance between the substrate 11 and the first electrode layer is measured. At this time, when the measured resistance is a specified value or higher (for example, 1 MΩ or higher), the solar cell submodule 100 is treated as pass.

According to the solar cell submodule 100 described above, in a case where the plurality of photoelectric conversion elements 10-1, 10-2, ... 10-k forms a single unit, it is possible to connect a plurality of the units in parallel between the positive electrode 18 and the negative electrode 19. Furthermore, the plurality of units can be formed on one substrate 11. For example, even when a solar cell panel in which such a solar cell submodule 100 is used is partially in shade, the amount of power generated decreases only to a limited extent. Therefore, a solar cell panel that stably generates power is realized.

Conclusion

Several embodiments of the present invention have been described, but these embodiments are proposed as examples and do not intend to limit the scope of the present invention. These embodiments can be carried out in a variety of forms that are not described above and can be omitted, substituted, modified, and the like in a variety of manners within the scope of the gist of the present invention. These embodiments and modifications thereof are included in the scope and gist of the present invention, and the invention described in the claims and an equivalent thereof are also included in the scope and gist of the present invention.

REFERENCE SIGNS LIST

10 Photoelectric conversion element
11 Substrate
12 First electrode layer
13 Photoelectric conversion layer
13A Front surface-side region
13B Intermediate region
13C Rear surface-side region
13p Precursor layer
14 Buffer layer
15 Second electrode layer
16 Selenium source gas
17 Sulfur source gas
18 Positive electrode
19 Negative electrode
21 Insulating layer
100 Solar cell submodule

The invention claimed is:

1. A photoelectric conversion element comprising:
a photoelectric conversion layer that is formed between a first electrode layer and a second electrode layer,
wherein the photoelectric conversion layer contains Group I elements of Cu and Ag, Group III elements of In and Ga, and Group VI elements of Se and S,
the photoelectric conversion layer has a front surface-side region that is positioned on a light-receiving surface side, a rear surface-side region that is positioned on a rear surface side of a light-receiving surface, and an intermediate region that is positioned between the front surface-side region and the rear surface-side region,
a portion at which a minimum value of a band gap appears in a thickness direction of the photoelectric conversion layer is included in the intermediate region, and
when a ratio (Ag/(non-Ag I+III+VI)) of a mole amount of Ag to a sum of mole amounts of the Group I elements other than Ag, the Group III elements, and the Group VI elements is defined as an Ag concentration, a portion at which a maximum value of the Ag concentration appears in the thickness direction of the photoelectric conversion layer is included in the intermediate region,
wherein the maximum value of the Ag concentration is 0.00519 to 0.0140 and the mole amount of Ag in the rear surface-side region is 0.19 or less of the mole amount of Ag in the entire photoelectric conversion layer.

2. The photoelectric conversion element according to claim 1,
wherein the portion at which the maximum value of the Ag concentration appears is positioned closer to the light-receiving surface of the photoelectric conversion layer than a rear surface of the photoelectric conversion layer in the thickness direction of the photoelectric conversion layer.

3. The photoelectric conversion element according to claim 1,
wherein the portion at which the maximum value of the Ag concentration appears is positioned closer to a boundary of the intermediate region on the light-receiving surface side than a boundary of the intermediate region on the rear surface side in the thickness direction of the photoelectric conversion layer.

4. The photoelectric conversion element according to claim 1, wherein the portion at which the maximum value of the Ag concentration appears is positioned in the rear surface side of the photoelectric conversion layer with respect to the portion at which the minimum value of the band gap appears in the thickness direction of the photoelectric conversion layer.

5. The photoelectric conversion element according to claim 1,
wherein the intermediate region is positioned in a range of 0.1 to 0.7 from the light-receiving surface of the photoelectric conversion layer as a reference in the thickness direction of the photoelectric conversion layer when a thickness of the photoelectric conversion layer is normalized as 1.

6. The photoelectric conversion element according to claim 1,
wherein the mole amount of Ag in the front surface-side region is 0.06 or less of the mole amount of Ag in the entire photoelectric conversion layer.

7. The photoelectric conversion element according to claim 1,
wherein the band gap of the photoelectric conversion layer is 1.04 eV to 1.20 eV.

8. A method for manufacturing a photoelectric conversion element having a photoelectric conversion layer that is formed between a first electrode layer and a second electrode layer, the method comprising:
forming the first electrode layer;
forming a precursor layer containing Group I elements of Cu and Ag and Group III elements of In and Ga on the first electrode layer;
turning the precursor layer into a chalcogenide to form the photoelectric conversion layer; and
forming the second electrode layer on the photoelectric conversion layer,
wherein, in the forming the precursor layer, a layer containing at least Cu, a layer containing at least one of In and Ga, and a layer containing Ag are formed, respectively,
the layer containing Ag in the precursor layer is formed between a layer including a first surface on a first electrode layer side and a layer including a second surface on a second electrode layer side, and
the layer containing Ag contains a larger amount of Ag than the layer containing at least Cu and the layer containing at least one of In and Ga,
wherein, when a ratio (Ag/(non-Ag I+III+VI)) of a mole amount of Ag to a sum of mole amounts of the Group I elements other than Ag, the Group III elements, and the Group VI elements is defined as an Ag concentration, a maximum value of the Ag concentration in the layer containing Ag is 0.00519 to 0.0140 and the mole amount of Ag in the rear surface-side region is 0.19 or less of the mole amount of Ag in the entire photoelectric conversion layer.

9. The method for manufacturing a photoelectric conversion element according to claim 8,
wherein, when, between regions obtained by equally dividing a mole amount of an element in the precursor layer into two parts in a thickness direction, a region on the first electrode layer side is defined as a first region, and a region on a light-receiving surface side is defined as a second region, a mole amount of Ag in the second region is larger than a mole amount of Ag in the first region.

* * * * *